(12) United States Patent
Fujii et al.

(10) Patent No.: US 7,649,236 B2
(45) Date of Patent: Jan. 19, 2010

(54) SEMICONDUCTOR PHOTODETECTOR AND PHOTODETECTING DEVICE HAVING LAYERS WITH SPECIFIC CRYSTAL ORIENTATIONS

(75) Inventors: Yoshimaro Fujii, Hamamatsu (JP); Kouji Okamoto, Hamamatsu (JP); Akira Sakamoto, Hamamatsu (JP)

(73) Assignee: Hamamatsu Photonics K.K., Hamamatsu-shi, Shizuoka (JP)

( * ) Notice: Subject to any disclaimer, the term of this patent is extended or adjusted under 35 U.S.C. 154(b) by 340 days.

(21) Appl. No.: 11/429,454

(22) Filed: May 8, 2006

(65) Prior Publication Data
US 2006/0267126 A1    Nov. 30, 2006

(51) Int. Cl.
*H01L 31/036*    (2006.01)
(52) U.S. Cl. .................. 257/458; 257/433; 257/461; 257/E31.001; 257/E33.076; 257/464; 257/545; 257/656; 257/E29.336
(58) Field of Classification Search .................. None
See application file for complete search history.

(56) References Cited

U.S. PATENT DOCUMENTS 5,252,852 A * 10/1993 Makiuchi et al. ............ 257/458

6,559,539 B2 * 5/2003 Tu et al. ...................... 257/723

FOREIGN PATENT DOCUMENTS

| JP | 51-57174 | 5/1976 |
|---|---|---|
| JP | 4-242980 | 8/1992 |
| JP | 5-67800 | 3/1993 |
| JP | 6-224458 | 8/1994 |
| JP | 2000-261026 | 9/2000 |
| JP | 2002-76326 | 3/2002 |
| JP | 2003-294846 | 10/2003 |
| JP | 2004-327846 | 11/2004 |

\* cited by examiner

*Primary Examiner*—Minh-Loan T Tran
*Assistant Examiner*—Fei Fei Yeung Lopez
(74) *Attorney, Agent, or Firm*—Drinker Biddle & Reath LLP

(57) ABSTRACT

A semiconductor photodetector 10 has a first semiconductor substrate 1 that is of a first conductive type and a low resistivity and has a (111) front surface, and a second semiconductor substrate 2 that is of the first conductive type and a high resistivity, has a (100) front surface, and is adhered onto first semiconductor substrate 1. A semiconductor region 3 of a second conductive type is formed on the front surface side of second semiconductor substrate 2. A region of a periphery of semiconductor region 3 is etched until first semiconductor substrate 1 is exposed. A first electrode 1e and a second electrode 2e are electrically connected to the exposed front surface of first semiconductor substrate 1 and to semiconductor region 3, respectively.

6 Claims, 12 Drawing Sheets

SEMICONDUCTOR PHOTODETECTOR AND PHOTODETECTING DEVICE HAVING LAYERS WITH SPECIFIC CRYSTAL ORIENTATIONS

BACKGROUND OF THE INVENTION

1. Field of the Invention

The present invention relates to a semiconductor photodetector and a photodetecting device.

2. Related Background Art

High-speed response characteristics are being demand more than ever in recent years in the field of optical semiconductor devices, and especially photodetectors. Demands for high-speed response, high S/N ratio, low cost, etc., for various wavelengths of light emitting devices are becoming stronger especially with photodetectors for information communication that send and receive large volumes of information.

For example, Patent Document 1 discloses a PIN photodiode for optical communication that is equipped with high-speed response characteristics. With this PIN photodiode, an N-type semiconductor region of high resistivity is epitaxially grown on an N-type semiconductor substrate of low resistivity. In this N-type semiconductor region (epitaxial layer), a photodetecting region is formed from a P-type semiconductor region. The N-type and P-type semiconductor regions form a PN junction that is used by applying a reverse bias.

Conventionally, a PIN photodiode with such an arrangement is positioned inside a can package. Since this can type optical semiconductor device is not suited for achieving thinness and compact size, it cannot meet the compactness requirements demanded in the information communication field. Molded devices, aimed at achieving compact size, are thus beginning to be developed. Photodetectors described in the following Patent Document 2 and Patent Document 3 are also known.

Patent Document 1: Japanese Published Unexamined Patent Application No. Hei 5-67800

Patent Document 2: Japanese Published Unexamined Patent Application No. Hei 4-242980

Patent Document 3: Japanese Published Unexamined Patent Application No. Sho 51-057174

SUMMARY OF THE INVENTION

Though an entirety of a photodetector can be made compact and thin by disposing a positive electrode and a negative electrode at one side of a substrate, in this case, a depletion layer does not spread readily into an optical absorbing region and high photodetection sensitivity and high-speed response characteristics cannot be maintained.

The present invention was made in view of this issue and an object thereof is to provide a semiconductor photodetector and a photodetecting device that can be made compact and thin while maintaining high-speed response characteristics.

In order to achieve the above object, a semiconductor photodetector according to the present invention includes: a first semiconductor substrate, being of a first conductive type and a low resistivity and having a (111) front surface; and a second semiconductor substrate, being of the first conductive type and a high resistivity, having a (100) front surface, and being adhered onto the first semiconductor substrate; and is characterized in that a semiconductor region of a second conductive type is formed on the front surface side of the second semiconductor substrate, a region of a periphery of the semiconductor region of the second semiconductor substrate is etched until the first semiconductor substrate is exposed, and a first electrode and a second electrode, across which a bias voltage is applied, are electrically connected to the exposed front surface of the first semiconductor substrate and the semiconductor region, respectively.

Here, "high resistivity" and "low resistivity" shall signify a relative relationship between resistivities.

In this case, because both the first and the second electrodes (pad) are electrically connected at one side (exposed front surface and semiconductor region) of the photodetector, the photodetector can be made compact. Because the region of the periphery of the second semiconductor substrate is etched, the second semiconductor substrate takes on a "mesa" shape and the first semiconductor substrate is completely exposed at the etched portion. Though when two semiconductor substrates are adhered together, an oxide may become interposed locally at the interface in some cases, the oxide at the etched portion is removed. This portion is thus improved in flatness and the electrode mounting precision is improved.

Also with this mesa shape, the bias electrode can be applied, via the first electrode and the second electrode, in the thickness direction of the second semiconductor substrate, which is to be an optical absorbing layer. Since the first semiconductor substrate is of low resistivity, a potential at the first electrode is transmitted uniformly to the interface side of the second semiconductor substrate. Thus by applying the bias voltage across the first electrode and the second electrode, the bias voltage is applied across the interface with the first semiconductor substrate and the semiconductor region in the second semiconductor substrate of high resistivity.

Thus in accompaniment with the bias voltage application, a depletion layer can be formed widely in the thickness direction of the second semiconductor substrate and the photodetection sensitivity can be improved. Also, by setting the thickness of the second semiconductor substrate thinly so as to be no more than the depletion layer thickness required for operation, high-speed response characteristics can be maintained. Preferably, the thickness of the depletion layer formed in the second semiconductor substrate is set to be no more than 30 µm so that the high-speed response characteristics can be maintained.

Also, a light blocking film is preferably formed on side surfaces of the second semiconductor substrate. In this case, since light does not enter into the interior from side surfaces of the second semiconductor substrate, the generation of unwanted carriers can be restrained.

Preferably, the total thickness of the first and the second semiconductor substrates is no more than 100 µm and the first and the second semiconductor substrates are resin molded. That is, by setting the thickness of the second semiconductor substrate thinly so as to be no more than the depletion layer thickness required for operation and setting the thickness of the first semiconductor substrate as thin as possible, a high-speed element that is compact and thin can be formed. Also, since the thickness of the protective resin that molds the photodetector is made thin, warping of the substrate due to a thermal expansion coefficient difference between the substrate and the resin layer can be restrained and the reliability of the photodetector can be improved.

A photodetecting device according to the present invention is characterized in that a semiconductor photodetector is set on at least one of a wiring substrate and an integrated circuit chip and is resin molded. In this case, the semiconductor photodetector and the wiring substrate or the integrated circuit chip are protected by the resin. An output of the semiconductor photodetector is input into the integrated circuit that has functions of amplification, A/D conversion, etc.

By the semiconductor photodetector and the photodetecting device according to the present invention, compactness and thinness can be realized while maintaining high-speed response characteristics.

DESCRIPTION OF THE PREFERRED EMBODIMENTS

Figure 1:
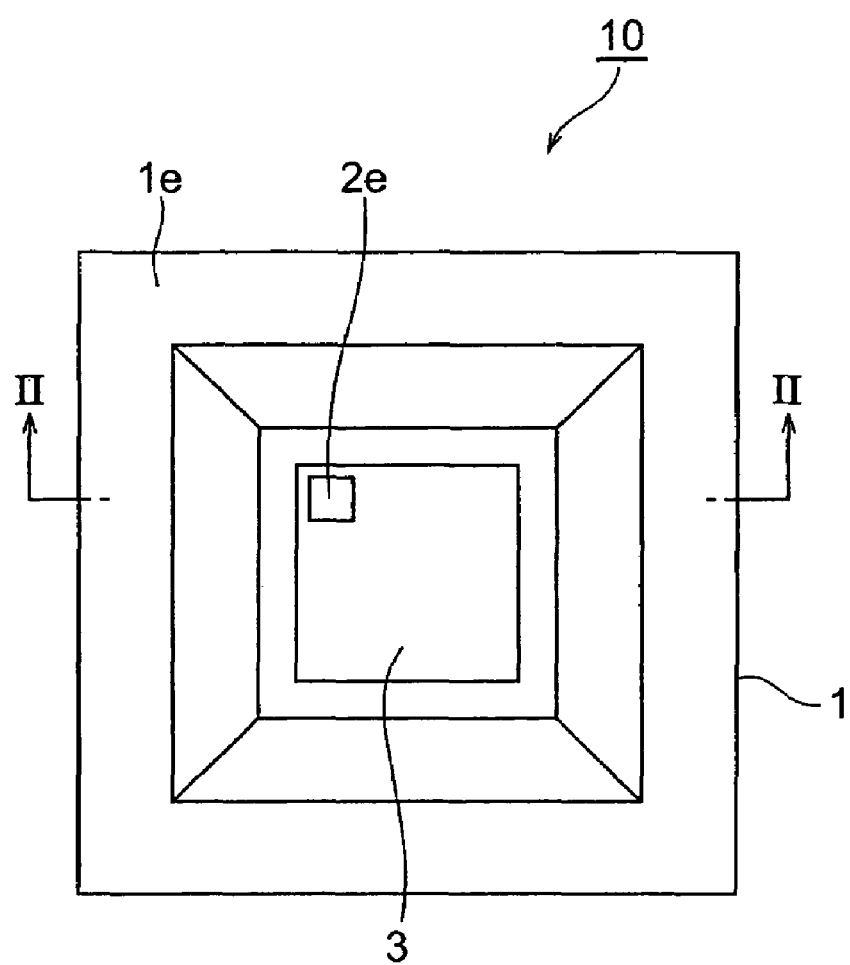
FIG. 1 is a plan view of a photodetector according to an embodiment.
Figure 2A:
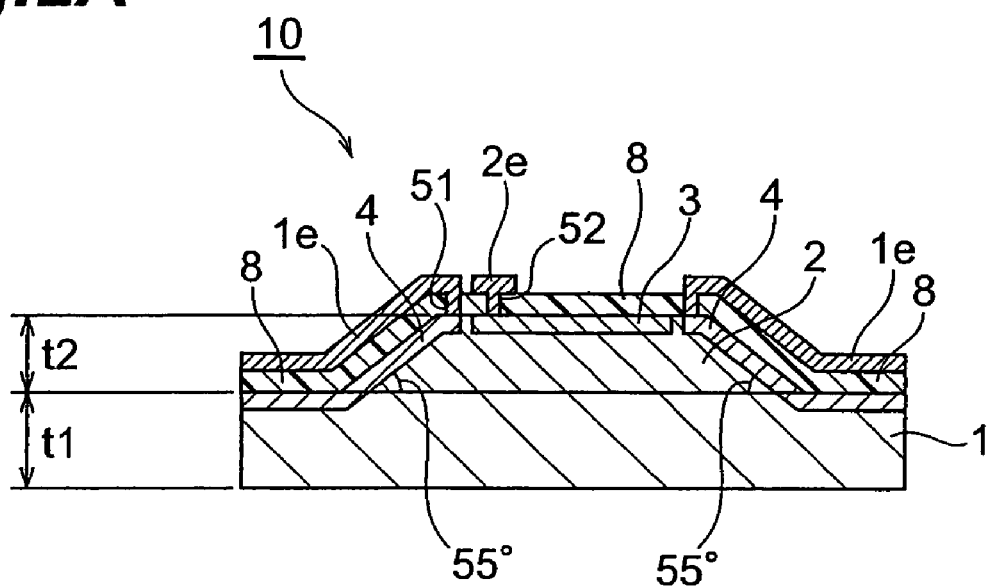
FIG. 2A is a sectional view taken on arrows II-II of the photodetector shown in FIG. 1

FIG. 1 is a plan view of a photodetector according to an embodiment. FIG. 2A is a sectional view taken on arrows II-II of the photodetector shown in FIG. 1.

This semiconductor photodetector 10 has an N-type (first conductive type) first semiconductor substrate 1 of low resistivity, an N-type second semiconductor substrate 2 of high resistivity, and a P-type (second conductive type) impurity-added region (semiconductor region) 3. Here, "high resistivity" and "low resistivity" shall signify a relative relationship between resistivities. That is, second semiconductor substrate 2 has a higher resistivity than first semiconductor substrate 1. The impurity concentration is relatively low in the case of high resistivity and the impurity concentration is relatively high in the case of low resistivity.

The resistivity of first semiconductor substrate 1 is, for example, approximately 0.001 Ω·cm. The resistivity of second semiconductor substrate 2 is, for example, approximately 1000 Ω·cm (=10 Ω·m). Because a depletion layer is thicker the lower the impurity concentration inside a semiconductor, by using second semiconductor substrate 2 of high resistivity and low impurity concentration, the junction capacitance of the PN junction can be lowered and the CR time constant can be made small. In the case of detecting light of no more than 850 nm from an LD or LED, it is sufficient for the second semiconductor substrate (optical absorbing layer) to be 30 µm in thickness.

That is, the thickness of second semiconductor substrate 2 is preferably set so that the thickness, from a bottom surface of P-type impurity-added region 3, formed on a front surface side of second semiconductor substrate 2, to a substrate adhesion interface, is equal to the width of a depletion layer that spreads by a reverse bias voltage being applied to semiconductor photodetector 10. A high response speed can thereby be realized in the photodetector favorably. The thickness of second semiconductor substrate 2 may be set so that the entirety thereof becomes depleted. A high response speed can be realized favorably in semiconductor photodetector 10 in this case as well.

By using an adhered substrate formed from semiconductor substrates that differ in plane orientation, increase of dark current can be restrained.

First semiconductor substrate 1 and second semiconductor substrate 2 are adhered together to form an adhered substrate. By using an adhered substrate formed from semiconductor substrates that differ in plane orientation, the increase of dark current can be restrained. P-type impurity-added region 3 is formed on a front surface side (side opposite the interface with first semiconductor substrate 1) of second semiconductor substrate 2. If the high resistivity region of second semiconductor substrate 2 is set to be of an I type, a PIN photodiode is formed by P-type impurity-added region 3, I-type second semiconductor substrate 2, and N-type first semiconductor substrate 1. Since the conductive type of second semiconductor substrate 2 is actually an N type of low concentration, a PN junction is formed with P-type semiconductor region 3.

A case where silicon (Si) is used as the semiconductor material of the above components shall be described below. The plane orientation of a front surface of first semiconductor substrate 1 is (111). The plane orientation of the front surface of second semiconductor substrate 2 differs from that of first semiconductor substrate 1 and is (100).

A region of a periphery of P-type impurity-added region 3, formed on the front substrate surface side of second semiconductor substrate 2 is etched, for example by alkali etching, until the front surface of first semiconductor substrate 1 is exposed. Second semiconductor substrate 2 thus has a mesa shape. Side surfaces of the mesa type second semiconductor substrate 2 are positioned at the periphery of semiconductor region 3. A low resistivity layer 4, for restraining the generation of unwanted carriers, is formed on the side surfaces of second semiconductor substrate 2. In terms of conductive type, low resistivity layer 4 is of the N type (first conductive type). Low resistivity layer (semiconductor layer of high impurity concentration) 4 extends to the exposed front surface of first semiconductor substrate 1.

The exposed front surface of first semiconductor substrate 1 and the side surfaces and a top surface of second semiconductor substrate 2 are covered by a passivation film 8, formed of $SiO_2$, etc. A first electrode contact hole 51 and a second electrode contact hole 52 are bored in passivation film 8. First electrode contact hole 51 is formed so that a first electrode 1e formed in the interior is contacted and connected electrically to low resistivity layer 4. Second electrode contact hole 52 is formed so that a second electrode 2e formed in the interior is contacted and connected electrically to semiconductor region 3.

Figure 2B:
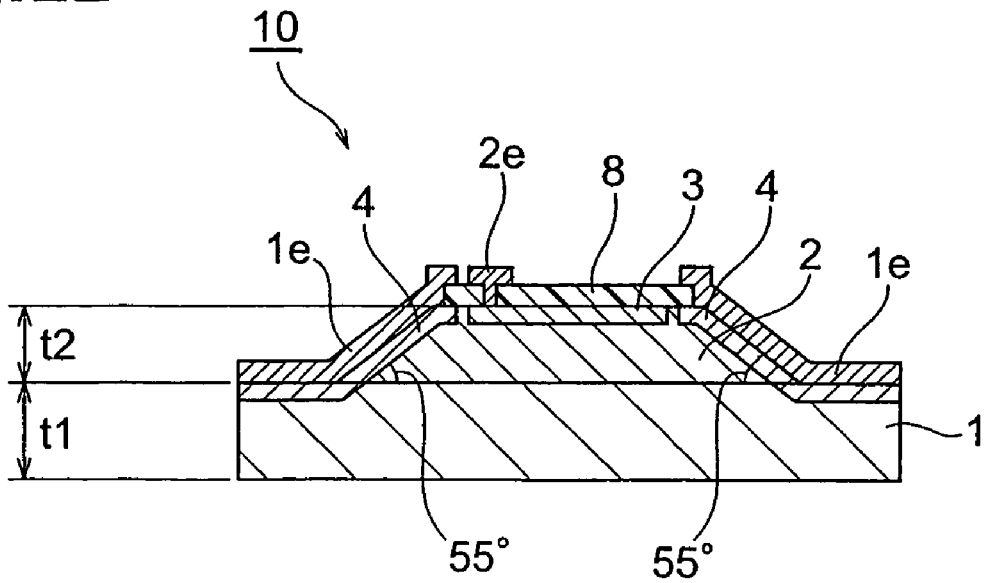
FIG. 2B is a sectional view of a photodetector according to a modification example.

First electrode 1e and second electrode 2e are thus electrically connected to the exposed front surface of first semiconductor substrate 1 and to semiconductor region 3, respectively. Though in the present example, first electrode 1e contacts low resistivity layer 4 at the top surface of second semiconductor substrate 2, first electrode 1e may contact low resistivity layer 4 on the exposed front surface of first semiconductor substrate 1 instead as shown in FIG. 2B.

Also with this example, first electrode 1e is formed of aluminum or other conductive material and forms a light blocking film. This light blocking film (1e) covers the exposed front surface of first semiconductor substrate 1 and the side surfaces and peripheral portions of the top surface of second semiconductor substrate 2. Light-blocking film (1e) is formed at least on the side surfaces of second semiconductor substrate 2, and a central portion of the top surface of second semiconductor substrate 2 is opened. Though in this case, light enters into the interior from the center of second semiconductor substrate 2, since light does not enter into the interior from the side surfaces, the generation of unwanted carriers can be restrained.

Because first electrode 1e and second electrode 2e are formed on one side (the exposed front surface of the first semiconductor substrate and semiconductor region 3) of the photodetector, the photodetector can be made compact and thin. Since the region of the periphery of second semiconductor substrate 2 is etched until first semiconductor substrate 1 is completely exposed, second semiconductor substrate 2 takes on a mesa-type shape.

Though when two semiconductor substrates are adhered together, an oxide ($SiO_2$) may become interposed at the interface in some cases, because the two substrates differ in plane orientation, the difference in etching rate according to plane orientation can be put to use to remove the corresponding portion of second semiconductor substrate 2 completely by etching. Thereby, the oxide at the etched portion is removed. The flatness of this portion is thus improved and the electrode mounting precision is improved.

Because first semiconductor substrate 1 is of low resistivity, a potential at first electrode 1e is transmitted uniformly to the interface side of the second semiconductor substrate via low resistivity layer 4. When a bias voltage is applied across first electrode 1e and second electrode 2e, the bias voltage is applied, at second semiconductor substrate 2 of high resistivity, across the interface with first semiconductor substrate 1 and semiconductor region 3. P-type semiconductor region 3 is an anode and N-type semiconductor substrate 1 is a cathode.

In accompaniment with an application of a reverse bias voltage, a depletion layer spreads adequately along the thickness direction of second semiconductor substrate 2, serving as an optical absorbing layer, and from the PN junction surface to the adhesion interface. The photodetection sensitivity can thus be made high. By setting thickness t2 of second semiconductor substrate 2 thinly so as to be no more than the required depletion layer thickness, high-speed response characteristics can be maintained. Preferably to enable maintaining of the high-speed response characteristics, the thickness of the depletion layer formed in second semiconductor substrate 2 is set to no more than 30 μm.

In mounting the semiconductor photodetector onto a wiring or circuit substrate, the total of thickness t1 of first semiconductor substrate 1 and thickness t2 of second semiconductor substrate 2 is no more than 100 μm, and first semiconductor substrate 1 and second semiconductor substrate 2 are resin molded. By setting thickness t2 of second semiconductor substrate 2 thinly so as to be no more than the required depletion layer thickness and setting thickness t1 of first semiconductor substrate 1 thinly as well, a high-speed photodetector that is compact and thin can be formed. The resin protects the photodetector, and by making the thickness of this resin thin, warping of the substrate due to a thermal expansion coefficient difference between the substrate and the resin layer can be restrained and the reliability of the photodetector can be improved.

The thinning of this semiconductor substrate can be realized by mechanical polishing.

A method of manufacturing the above-described semiconductor photodetector shall now be described using FIG. 3 to FIG. 9.

Figure 3:
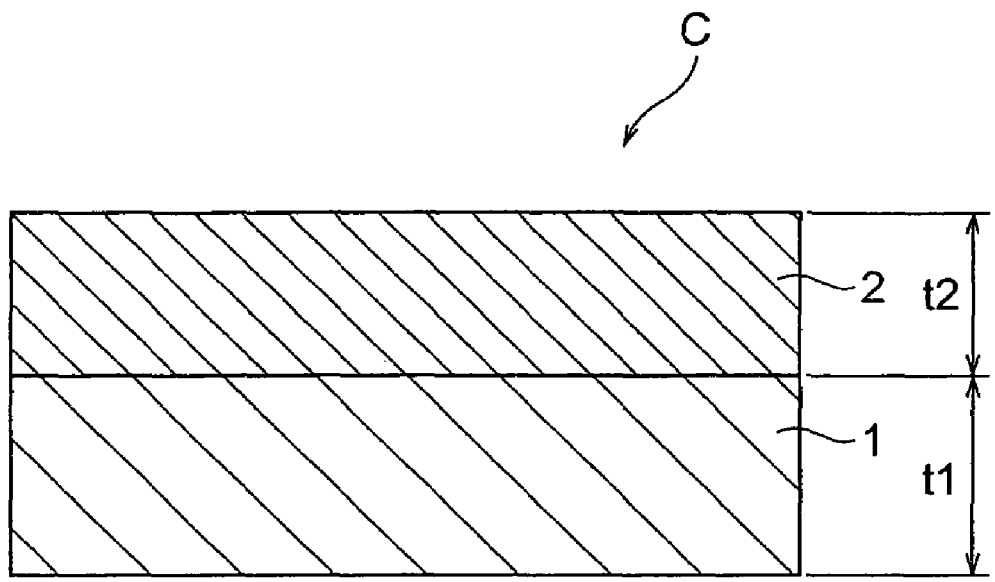
FIG. 3 is an explanatory diagram of a substrate adhesion step.

FIG. 3 is an explanatory diagram of a substrate adhesion step.

Firstly, first semiconductor substrate 1 and second semiconductor substrate 2 are prepared. First semiconductor substrate 1 is a (111) Si substrate of high impurity concentration, and second semiconductor substrate 2 is a (100) Si substrate of low impurity concentration. As a preferable example, thickness t1 of first semiconductor substrate 1 is set equal to 270 μm, and thickness t2 of second semiconductor substrate 2 is set equal to 300 μm.

The temperature during adhesion is preferably set to approximately 1100° C. At this temperature, the diffusion length of the diffusion of an impurity from first semiconductor substrate 1 of high impurity concentration into second semiconductor substrate 2 can be restrained to no more than 1 μm. That is, by setting the temperature during adhesion to approximately 1100° C., the impurity concentration profile in the substrate thickness direction near the interface of the adhered substrates can be kept sharp.

Though the following problems (1) to (3) may occur when the impurity in first semiconductor substrate 1 creeps up into second semiconductor substrate 2 and the N-type impurity concentration in second semiconductor substrate 2 rises, these problems do not occur in the present example since the temperature during adhesion is approximately 1100° C.
(1) The spreading of the depletion layer of second semiconductor substrate 2 during reverse bias application is hindered and the detection sensitivity drops.
(2) By the thickness of the depletion layer being made small, the junction capacitance and the time constant become large and the response speed drops.
(3) By the lowering of the impurity concentration of first semiconductor substrate 1, the unwanted carriers increase in lifetime and the photodetection precision drops.

Thus with the present example, the detection sensitivity, the response speed, and the photodetection precision can be improved.

Figure 4:
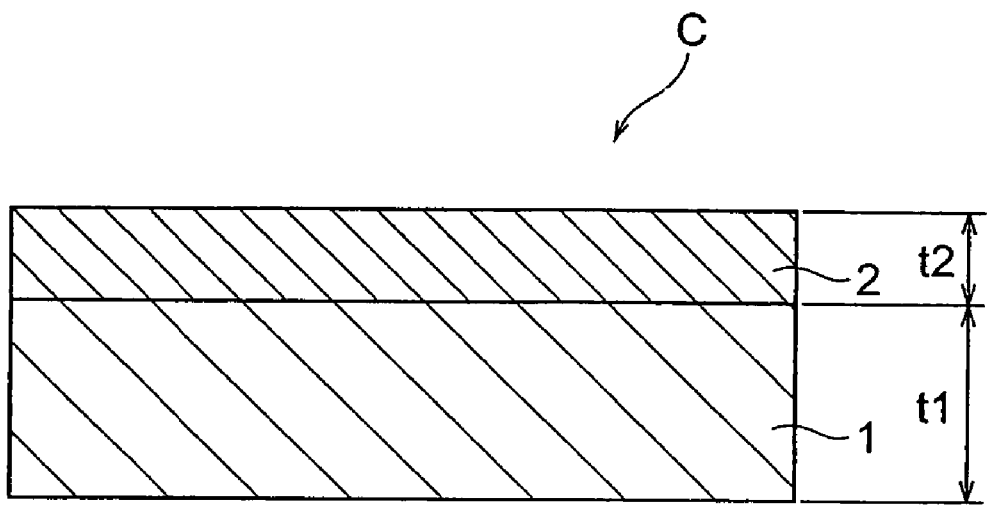
FIG. 4 is an explanatory diagram of a polishing step.

FIG. 4 is an explanatory diagram of a polishing step.

The front surface of second semiconductor substrate 2 is mechanically polished and the thickness t2 thereof is reduced. In the present example, polishing is performed until the thickness t2 becomes 30 μm.

Figure 5:
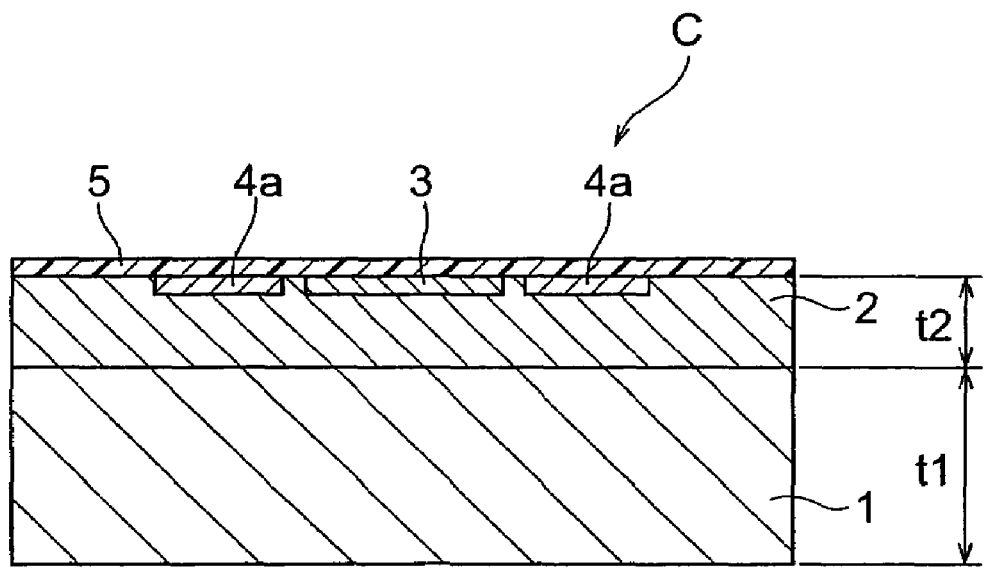
FIG. 5 is an explanatory diagram of an impurity layer forming step.

FIG. 5 is an explanatory diagram of an impurity layer forming step.

A mask that is opened at a central portion is then formed on the front surface of second semiconductor substrate 2, and a P-type impurity is added into the central region. Thereafter, another mask that is opened at a peripheral region is formed on the front surface of second semiconductor substrate 2, and an N-type impurity is added into the peripheral region. The substrate is then annealed at a suitable timing and the internal impurities are activated to form P-type impurity-added region 3, to which the P-type impurity was added, and an N-type impurity-added region 4a, to which the N-type impurity was added.

With P-type impurity-added region 3, sheet resistance $\rho=44$ Ω/sq. and thickness t=0.5 μm, and with N-type impurity-added region 4a, sheet resistance $\rho=12$ Ω/sq. and thickness t=1.0 μm. Examples of the P-type impurity include B, etc., and examples of the N-type impurity include P, As, etc. A first mask 5 is then formed on the front surface of second semiconductor substrate 2. First mask 5 is formed of $SiO_2$ and is formed by thermal oxidation of second semiconductor substrate 2.

Figure 6:
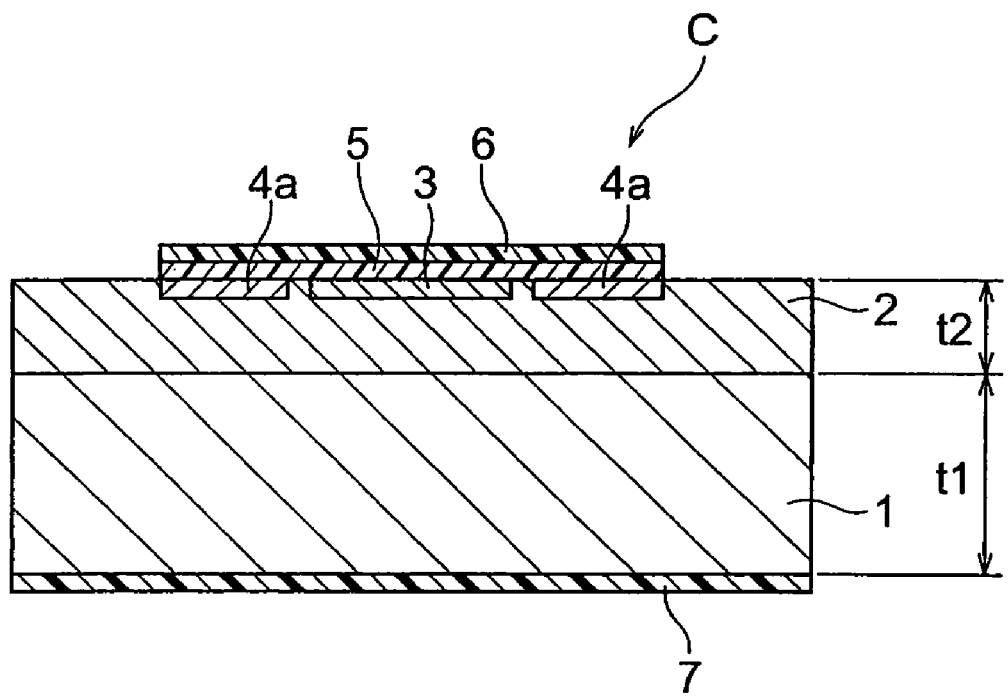
FIG. 6 is an explanatory diagram of a mask etching step.

FIG. 6 is an explanatory diagram of a mask etching step.

A second mask 6 and a third mask 7 are formed on the front surface and the back surface, respectively of composite semiconductor substrate (adhered substrate) C, formed of first semiconductor substrate 1 and second semiconductor substrate 2. Second mask 6 is formed of an SiN film. CVD, etc., is used as the method of forming second mask 6 and third mask 7. The SiN film at the front substrate surface side is formed so as to contact first mask 5. With each of second mask 6 and third mask 7, thickness t is set equal to 0.1 μm.

Chip periphery regions of second mask 6 and first mask 5 are then etched to expose the peripheral region of second semiconductor substrate 2. Dry etching using reactive ions may be employed to etch the SiN and $SiO_2$ films.

Figure 7:
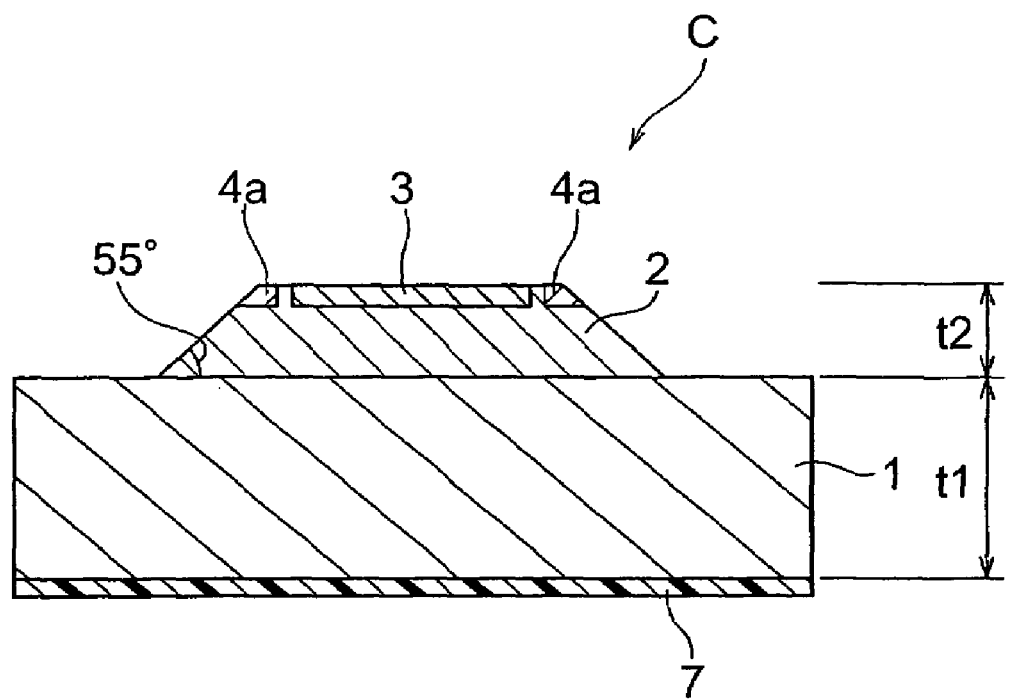
FIG. 7 is an explanatory diagram of a peripheral portion removing step.

FIG. 7 is an explanatory diagram of a peripheral portion removing step.

Using first mask 5 and second mask 6, shown in FIG. 6, wet etching of the peripheral region of second semiconductor substrate 2 is performed. An aqueous KOH solution is used as the etching solution (alkali etching). Because first semiconductor substrate 1 and second semiconductor substrate 2 differ in plane orientation and thus differ in etching rate, the present etching stops at the front surface of first semiconductor substrate 1. Second semiconductor substrate 2 is thus made to have a mesa type shape with side surfaces that are inclined at an angle of 55° with respect to the exposed surface of first semiconductor substrate 1. The mask remaining at the central portion of second semiconductor substrate 2 and mask 7, disposed on the back surface of first semiconductor substrate 1, are then removed.

Figure 8:
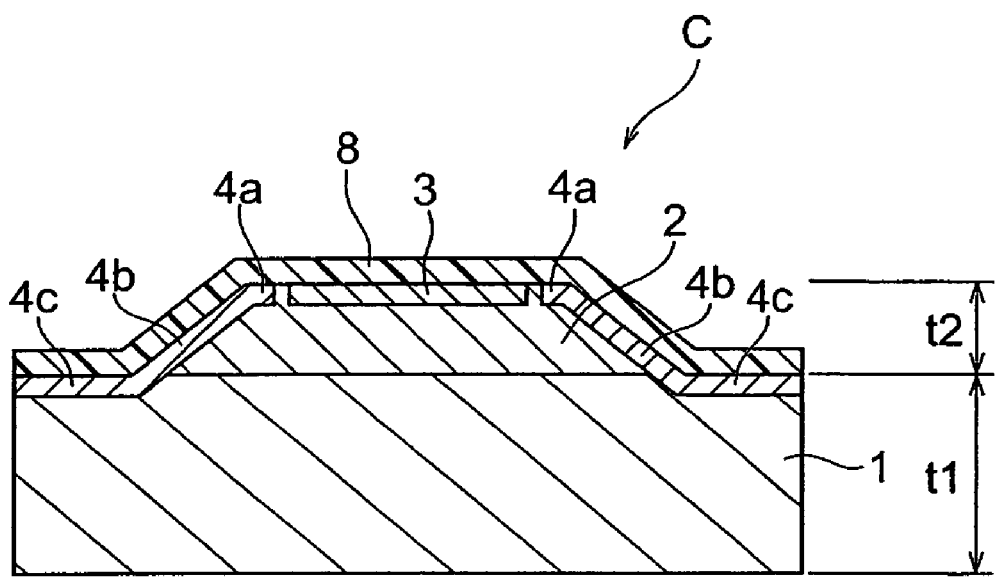
FIG. 8 is an explanatory diagram of a passivation film forming step.

FIG. 8 is an explanatory diagram of a passivation film forming step.

A mask that is formed of $SiO_2$ and is opened at the peripheral region of second semiconductor substrate 2 is then formed on second semiconductor substrate 2, and an N-type impurity is added from the side surfaces of semiconductor substrate 2 and the exposed surface of first semiconductor substrate 1 (ion injection; ion species: As; injection energy: 80 keV, $2 \times 10^{15}/cm^2$). An N-type impurity-added region 4b is formed at the side surfaces of second semiconductor substrate 2, and an N-type impurity-added region 4c is formed at the exposed surface side of first semiconductor substrate 1. These N-type impurity-added regions 4a, 4b, and 4c (4) are continuous and surround the central region of second semiconductor substrate 2. N-type impurity-added region 4a, 4b, and 4c (4) may also be formed by thermal diffusion.

The mask remaining on the central region of second semiconductor substrate 2 is then removed and the front substrate surface is oxidized to form a passivation film ($SiO_2$) 8 of thickness t=0.1 μm on the central region and side surfaces of second semiconductor substrate 2 and the exposed surface of first semiconductor substrate 1.

Figure 9:
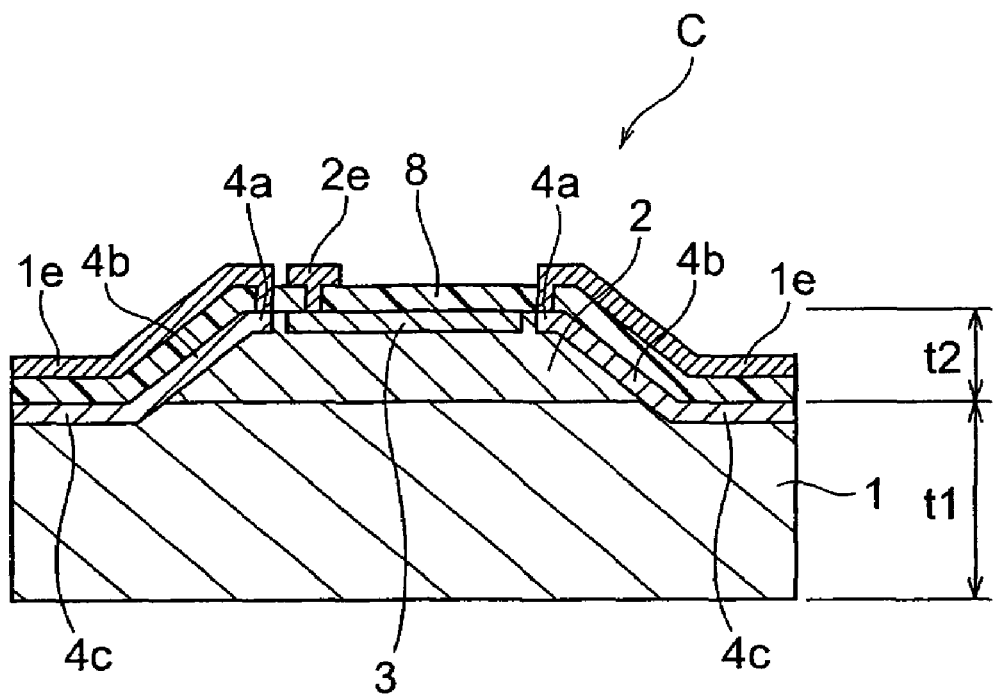
FIG. 9 is an explanatory diagram of an electrode forming step.

FIG. 9 is an explanatory diagram of an electrode forming step.

A contact hole is formed in passivation film 8 positioned above any of N-type impurity-added regions 4a, 4b, and 4c (4). A contact hole is also formed in passivation film 8 positioned above P-type impurity-added region 3. First electrode 1e and second electrode 2e are then formed inside these contact holes. Each of first electrode 1e and second electrode 2e is formed of aluminum, etc., and has a thickness t=1 μm.

By then polishing the back surface until t1+t2=100 μm for composite semiconductor substrate C, the above-described semiconductor photodetector is completed. First electrode 1e covers N-type impurity-added regions 4a, 4b, and 4c, that is, covers the side surfaces of second semiconductor substrate 2 and forms the light-blocking film.

Figure 10:
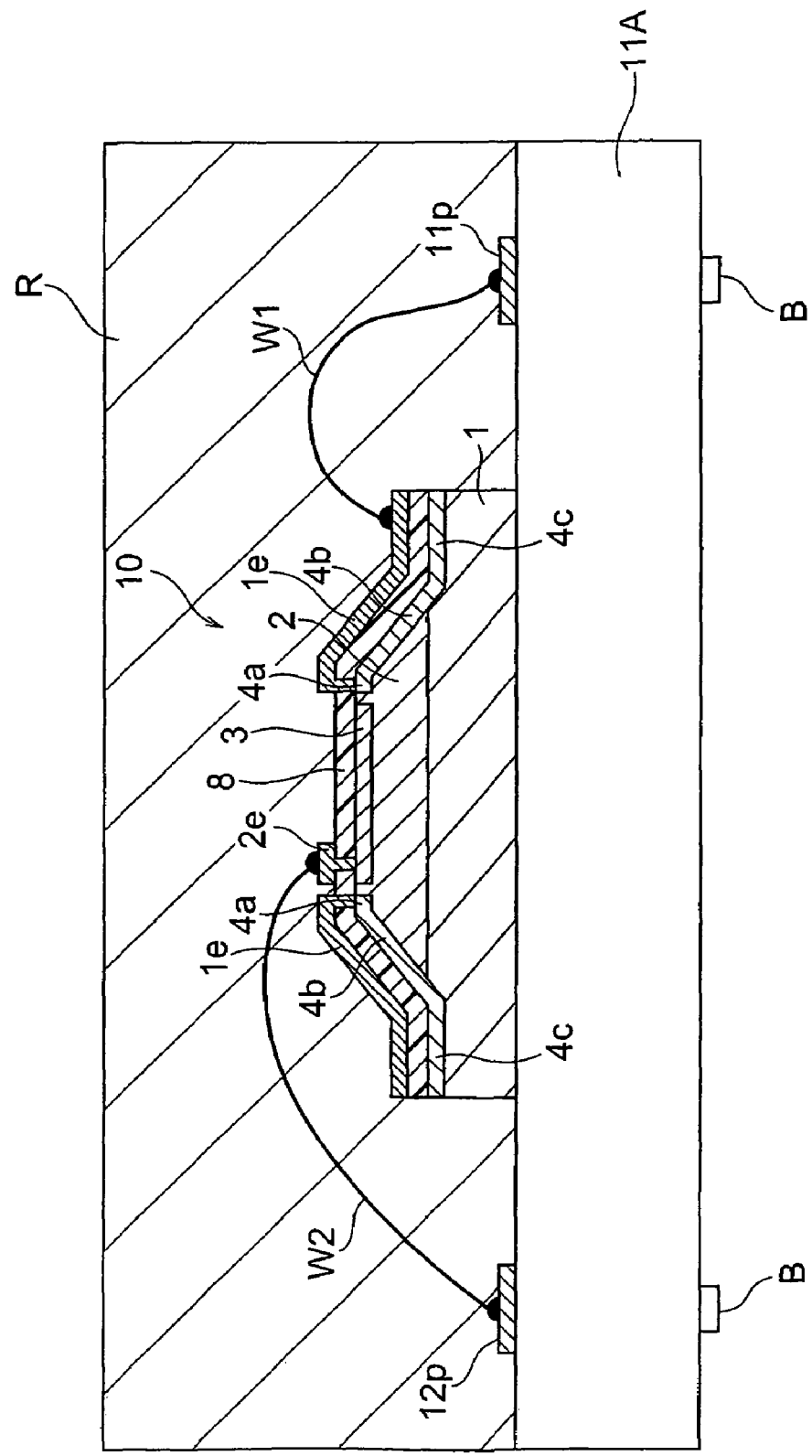
FIG. 10 is a longitudinal sectional view of a photodetecting device equipped with semiconductor photodetector 10 shown in FIG. 1 and FIG. 2A.

FIG. 10 is a longitudinal sectional view of a photodetecting device equipped with semiconductor photodetector 10 shown in FIG. 1 and FIG. 2A.

This photodetecting device has semiconductor photodetector 10 mounted on a wiring substrate (circuit substrate) 11A. An electrode pad 11p and an electrode pad 12p are formed on wiring substrate 11A. First electrode 1e is connected by a bonding wire W1 to electrode pad 11p, and second electrode 2e is connected by a bonding wire W2 to electrode pad 12p. On a bottom surface of wiring substrate 11A are provided lead pins or bumps B that are electrically connected respectively to electrode pad 11p and electrode pad 12p. Semiconductor photodetector 10 on wiring substrate 11A is molded by a resin R.

Figure 11:
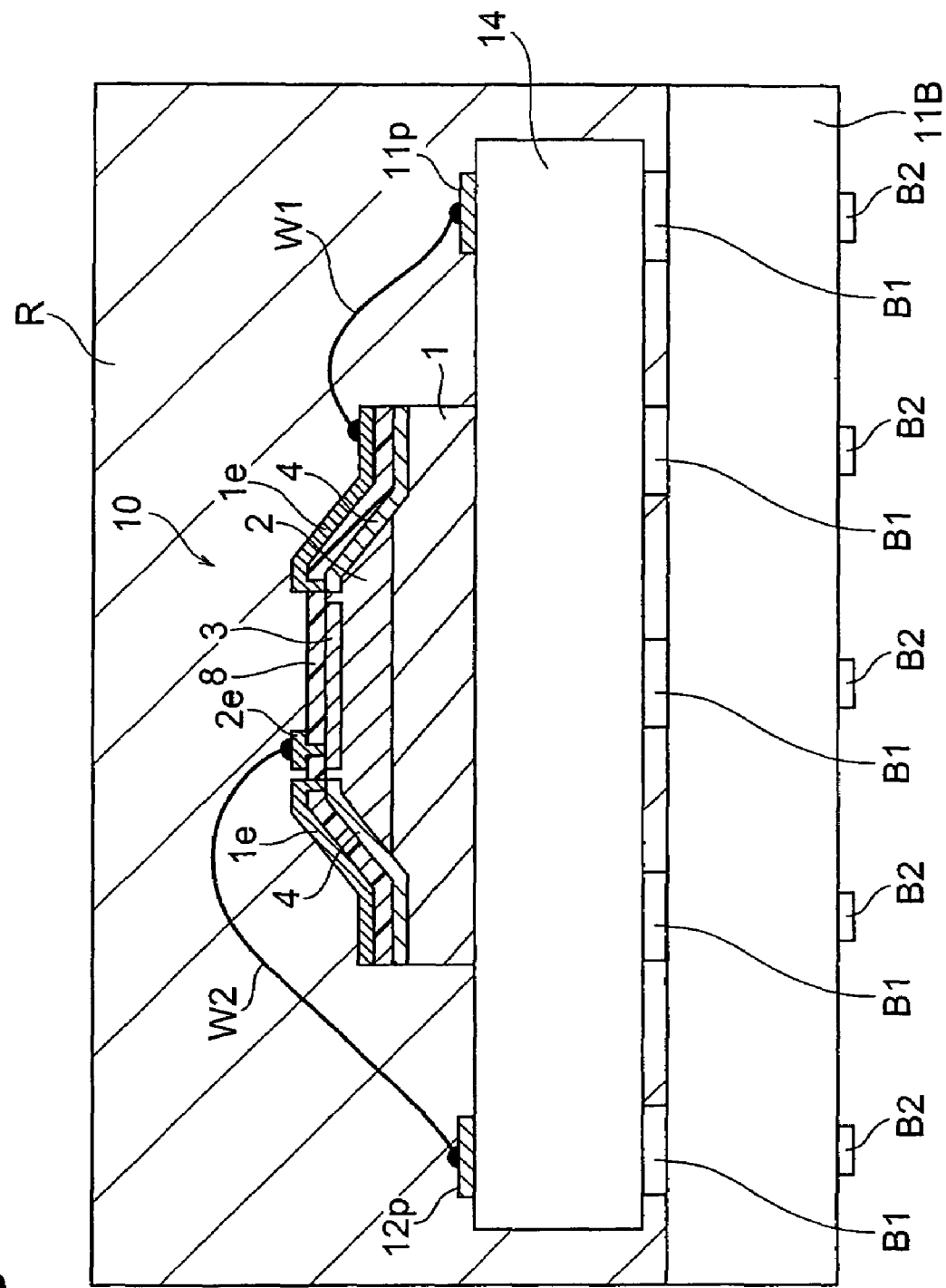
FIG. 11 is a longitudinal sectional view of a photodetecting device equipped with semiconductor photodetector 10 shown in FIG. 1 and FIG. 2A.

FIG. 11 is a longitudinal sectional view of a photodetecting device equipped with semiconductor photodetector 10 shown in FIG. 1 and FIG. 2A.

This photodetecting device has semiconductor photodetector 10 mounted on an integrated circuit chip 14. Integrated circuit chip 14 is mounted on a wiring substrate (circuit substrate) 11B, first electrode 1e is connected by bonding wire W1 to electrode pad 11p, and second electrode 2e is connected by bonding wire W2 to electrode pad 12p. Semiconductor photodetector 10 on wiring substrate 11B is resin molded.

In this case, semiconductor photodetector 10 and integrated circuit chip 14 are protected by resin R. An output of semiconductor photodetector 10 is input into the integrated circuit. The integrated circuit has functions of amplification, AD conversion, etc.

A plurality of leads or bumps B1 are provided on a back face of integrated circuit chip 14. Bumps B1 are electrically connected to a plurality of leads or bumps B2 disposed on a lower portion of wiring substrate 11B.

Figure 12:
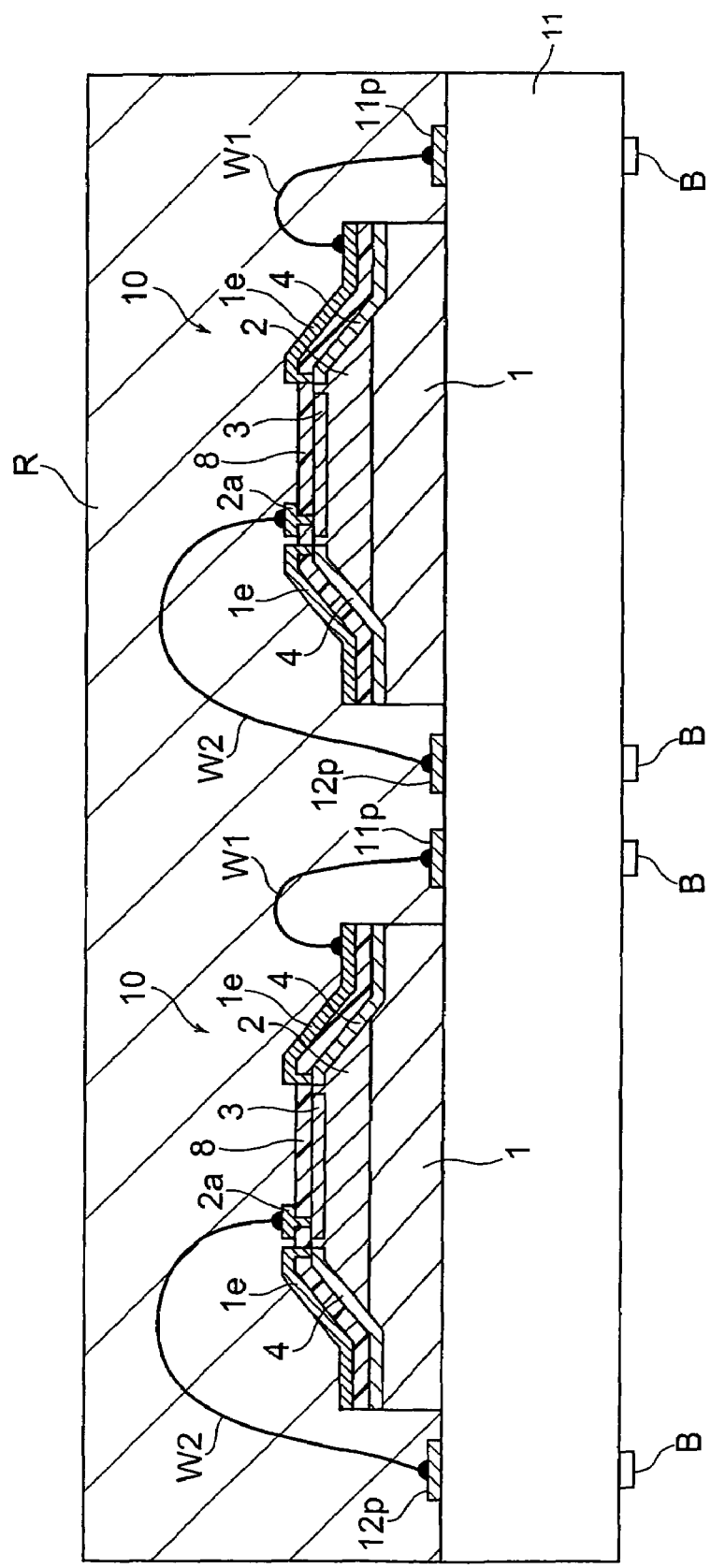
FIG. 12 is a longitudinal sectional view of a photodetecting device according to an embodiment.

FIG. 12 is a longitudinal sectional view of photodetecting device according to an embodiment.

First electrode 1e on wiring substrate 11 is connected by bonding wire W1 to electrode pad 11p, and second electrode 2e is connected by bonding wire W2 to electrode pad 12p. With respect to the embodiment shown in FIG. 11, the present embodiment differs only in that there are a plurality of semiconductor photodetectors 10, and is the same in arrangement otherwise. In the present case, signal light that differ in incident position can be detected by the respective semiconductor photodetectors 10.

When the above-mentioned resin mold structure is used, because the entirety of the chip is made thin, the thickness of the region, including wires W1 and W2, that needs to be covered by the mold resin can be made thin, thereby restraining the tensile stress of the mold resin layer so that warping and deformation of wiring substrate 11 do not occur. Electrical disconnection and conduction faults due to disconnection of wires and separation of back surface electrodes can thus be prevented.

The present invention is not restricted to the above-described embodiment, and the conductive type of first semiconductor substrate 1 may be the P type, and the conductive type of second semiconductor substrate 2 may differ from the conductive type of the first semiconductor substrate. Also, the respective plane orientations of first semiconductor substrate 1 and second semiconductor substrate 2 are not restricted to the above-mentioned plane orientations as long as the plane orientations differ so that the etching rates differ and the etching rate of the second semiconductor substrate is greater.

Also in adhering the above-described first semiconductor substrate 1 and second semiconductor substrate 2 together, as long as the both of the faces that are to be adhered together are flat, the faces can be adhered together naturally by simply overlapping and heating and without applying pressure. Because second semiconductor substrate 2 is a semiconductor substrate of high resistivity, it provides the merit that its thickness can be controlled freely.

An epoxy-based resin that can be used as resin R has a thermal expansion coefficient of 40 ppm/° C. (150° C.). For example, with a printed circuit board of 60 mm×90 mm square and a board thickness of 0.33 mm, the thicker the resin layer, the greater the warping after molding. With a resin layer thickness of 0.17 mm, the warping is 8 mm, with a thickness of 0.26 mm, the warping is 11 mm, with a thickness of 0.35 mm, the warping is 13 mm, and with a thickness of 0.54 mm, the warping is 13 mm. If the chip thickness is made approximately 50 μm, the thickness of the entirety can be made no more than 0.3 mm.

The present invention can be used to provide a semiconductor photodetector and a photodetecting device.

What is claimed is:

1. A semiconductor photodetector comprising:
   a first semiconductor substrate, being of a first conductive type and a low resistivity and having a (111) front surface; and
   a second semiconductor substrate, being of the first conductive type and a high resistivity, having a (100) front surface, and being adhered onto the first semiconductor substrate; wherein
   a semiconductor region of a second conductive type is formed on the front surface side of said second semiconductor substrate,
   a region of a periphery of said semiconductor region of said second semiconductor substrate is etched until said first semiconductor substrate is exposed, and
   a first electrode and a second electrode, to which a bias voltage is applied, are electrically connected to the exposed front surface of said first semiconductor substrate and said semiconductor region, respectively.

2. The semiconductor photodetector according to claim 1, wherein a light blocking film is formed on side surfaces of said second semiconductor substrate.

3. The semiconductor photodetector according to claim 1, wherein the total thickness of said first and second semiconductor substrates is no more than 100 μm and said first and second semiconductor substrates are resin molded.

4. A photodetecting device wherein the semiconductor photodetector according to claim 1 is set on at least one of a wiring substrate and an integrated circuit chip and is resin molded.

5. The semiconductor photodetector according to claim 1, wherein said first and second semiconductor substrates are made of Si.

6. The semiconductor photodetector according to claim 1, wherein a low resistivity layer of the first conductive type is formed on side surfaces of said second semiconductor substrate, said low resistivity layer extending to the exposed front surface of said first semiconductor substrate.

* * * * *